(12) United States Patent
Zuo et al.

(10) Patent No.: US 10,748,937 B2
(45) Date of Patent: Aug. 18, 2020

(54) SUBSTRATE AND MANUFACTURING METHOD THEREOF AND DISPLAY DEVICE

(71) Applicant: BOE TECHNOLOGY GROUP CO., LTD., Beijing (CN)

(72) Inventors: Yueping Zuo, Beijing (CN); Hongwei Tian, Beijing (CN); Shuai Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/051,947

(22) Filed: Aug. 1, 2018

(65) Prior Publication Data
US 2019/0189639 A1 Jun. 20, 2019

(30) Foreign Application Priority Data
Dec. 14, 2017 (CN) .......................... 2017 1 1340375

(51) Int. Cl.
*H01L 27/12* (2006.01)
*H01L 21/027* (2006.01)
(Continued)

(52) U.S. Cl.
CPC ...... *H01L 27/1218* (2013.01); *H01L 21/0274* (2013.01); *H01L 27/124* (2013.01); *H01L 27/1248* (2013.01); *H01L 27/1262* (2013.01); *H01L 27/1288* (2013.01); *H01L 27/3276* (2013.01); *H01L 27/3288* (2013.01); *H01L 51/0097* (2013.01); *G02F 1/1368* (2013.01);
(Continued)

(58) Field of Classification Search
CPC ......... H01L 51/0097; H01L 2251/5338; H01L 27/124; H01L 27/1248; G02F 1/133305
See application file for complete search history.

(56) References Cited

U.S. PATENT DOCUMENTS 9,450,038 B2 * 9/2016 Kwon ................ H01L 27/3276
9,773,853 B2 9/2017 Tao et al.
(Continued)

FOREIGN PATENT DOCUMENTS

| CN | 105074802 A | 11/2015 |
| CN | 105789252 A | 7/2016 |

(Continued)

OTHER PUBLICATIONS

Chinese Office Action in corresponding Chinese Application No. 201711340375.2 dated Nov. 25, 2019 (an English translation attached hereto). 14 pages.
(Continued)

*Primary Examiner* — Dung A. Le
(74) *Attorney, Agent, or Firm* — Leason Ellis LLP (57) ABSTRACT

A substrate and a manufacturing method thereof and a display device are provided. The substrate includes: a base including a bendable region; an interlayer on the base and in the bendable region; and a signal line at a side, facing away from the base, of the interlayer. In the bendable region, an orthographic projection of the signal line on the base is within an orthographic projection of the interlayer on the base; and in the bendable region, the interlayer is provided with a groove on at least one side of a portion, corresponding to the signal line, of the interlayer.

19 Claims, 3 Drawing Sheets

(51) Int. Cl.
  *H01L 27/32* (2006.01)
  *H01L 51/00* (2006.01)
  *G02F 1/1368* (2006.01)
  *G02F 1/1362* (2006.01)
  *G02F 1/1333* (2006.01)

(52) U.S. Cl.
  CPC .. *G02F 1/133305* (2013.01); *G02F 1/136286* (2013.01); *G02F 2001/133357* (2013.01); *G02F 2001/136295* (2013.01); *H01L 27/3258* (2013.01); *H01L 27/3262* (2013.01); *H01L 2227/323* (2013.01); *H01L 2251/5338* (2013.01)

(56) References Cited

U.S. PATENT DOCUMENTS

| | | |
|---|---|---|
| 10,247,971 B2 | 4/2019 | Kwon et al. |
| 10,528,170 B2 | 1/2020 | Choi et al. |
| 2012/0062447 A1 | 3/2012 | Tseng et al. |
| 2014/0232956 A1* | 8/2014 | Kwon ............... G02F 1/133305 349/12 |
| 2017/0125505 A1* | 5/2017 | Oh .......................... H01L 51/52 |
| 2018/0123060 A1* | 5/2018 | Jang .................... H01L 27/3276 |
| 2019/0363154 A1* | 11/2019 | Kaneko .................. H05B 33/02 |

FOREIGN PATENT DOCUMENTS

| | | |
|---|---|---|
| CN | 106595469 A | 4/2017 |
| CN | 107180848 A | 9/2017 |

OTHER PUBLICATIONS

Chinese Office Action in corresponding Chinese Application No. 201711340375.2 dated May 29, 2020 (an English translation attached hereto). 8 pages.

\* cited by examiner

SUBSTRATE AND MANUFACTURING METHOD THEREOF AND DISPLAY DEVICE

CROSS-REFERENCE TO RELATED APPLICATION

The present application claims priority of the Chinese Patent Application No. 201711340375.2 filed on 14 Dec. 2017, the disclosure of which is incorporated herein by reference in its entirety as part of the present application.

TECHNICAL FIELD

At least one embodiment of the present disclosure relates to a substrate and a manufacturing method thereof and a display device.

BACKGROUND

With the popularization of electronic display products, users have higher requirements for the appearances and structures of the electronic display products, so narrow frame or frameless electronic display products such as display screens are born in need. For example, in a design structure of a narrow frame or a frameless display screen, the non-display portion of the display screen is bent to the back of the display screen, but the bending process may lead to the breakage of some signal lines, which affects the yield of the product and increases the production costs.

SUMMARY

At least one embodiment of the present disclosure provides a substrate, and the substrate includes a base including a bendable region; an interlayer on the base and in the bendable region, and a signal line at a side, facing away from the base, of the interlayer; in the bendable region, an orthographic projection of the signal line on the base is within an orthographic projection of the interlayer on the base; and the interlayer is provided with a groove on at least one side of a portion, corresponding to the signal line, of the interlayer.

For example, at least a portion of the signal line is curved.

For example, the groove includes a linear groove extending in a direction in which the signal line adjacent to the linear groove extends.

For example, an edge of the linear groove is parallel to an edge, close to the edge of the linear groove, of the signal line adjacent to the linear groove.

For example, the substrate provided by at least one embodiment of the present disclosure further includes a component region and a pad region, and the bendable region is between the component region and the pad region; in a case where a portion, in the bendable region, of the base is in a bent state, the pad region overlaps the component region; and the signal line extends from the component region to the pad region.

For example, in the substrate provided by at least one embodiment of the present disclosure, the groove adjacent to the signal line includes a first end and a second end which are opposite to each other, the first end reaches at least a boundary of the component region and the bendable, and the second end reaches at least a boundary of the pad region and the bendable region.

For example, in the substrate provided by at least one embodiment of the present disclosure, in a thickness direction of the interlayer, the groove passes through the interlayer.

For example, in the substrate provided by at least one embodiment of the present disclosure, in a direction from the component region to the pad region, a distance from a center of a curved portion of the signal line to the component region is equal to a distance from the center of the curved portion of the signal line to the pad region.

For example, in the substrate provided by at least one embodiment of the present disclosure, an entirety of a portion, in the bendable region, of the signal line is curved.

For example, in the substrate provided by at least one embodiment of the present disclosure, each one of two sides of the portion, corresponding to the signal line, of the interlayer is provided with at least one groove.

For example, in the substrate provided by at least one embodiment of the present disclosure, the interlayer is in direct contact with the base.

For example, in the substrate provided by at least one embodiment of the present disclosure, a Young's modulus of a material of the interlayer is less than or equal to that of a material of the base.

For example, in the substrate provided by at least one embodiment of the present disclosure, a material of the interlayer includes an organic material.

For example, in the substrate provided by at least one embodiment of the present disclosure, the interlayer includes an organic material layer in direct contact with the signal line.

For example, the substrate provided by at least one embodiment of the present disclosure further includes at least one of a buffer layer, a gate insulating layer, an interlayer dielectric layer, a passivation layer and a planarization layer on the base, and a portion of the buffer layer, the gate insulating layer, the interlayer dielectric layer, the passivation layer and the planarization layer in the bendable region serves as the interlayer.

At least one embodiment of the present disclosure further provides a display device including the substrate described in any one of the embodiments described above.

At least one embodiment of the present disclosure further provides a manufacturing method of the substrate, and the method includes: forming an interlayer in a bendable region of a base; forming a signal line on a side, facing away from the base, of the interlayer, so that an orthographic projection of the signal line on the base is within an orthographic projection of the interlayer on the base in the bendable region; and forming a groove in the interlayer and on at least one side of a portion, corresponding to the signal line, of the interlayer.

For example, in the manufacturing method of the substrate provided by at least one embodiment of the present disclosure, forming the interlayer and the signal line includes: forming an insulating material film on the base; forming a conductive material film on the insulating material film and performing a patterning process to the conductive material film to form the signal line; and performing a patterning process to the insulating material film, and forming the groove on at least one side of a portion, corresponding to the signal line, of the insulating material film to form the interlayer.

For example, in the manufacturing method of the substrate provided by at least one embodiment of the present disclosure, forming the interlayer and the signal line includes: forming an insulating material film on the base; forming a conductive material film on the insulating material film; and performing a patterning process to the conductive material film and the insulating material film to form the signal line and the interlayer.

For example, in the manufacturing method of the substrate provided by at least one embodiment of the present disclosure, a material of the interlayer includes a photoresist material, and forming the interlayer and the signal line includes: forming a photoresist layer on the base; forming a conductive material film on the photoresist layer; performing a patterning process to the conductive material film to form the signal line; and exposing the photoresist layer by using the signal line as a mask and developing the photoresist layer that has been exposed to form the interlayer.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

At least one embodiment of the present disclosure provides a substrate, and the substrate includes: a base including a bendable region; an interlayer on the base and in the bendable region; and at least one signal line at a side, facing away from the base, of the interlayer. In the bendable region, an orthographic projection of the at least one signal line on the base is within an orthographic projection of the interlayer on the base; and in the bendable region, a portion, which does not overlap the signal line, of the interlayer is provided with at least one groove. In the embodiment of the present disclosure, by providing at least one groove in the interlayer, in the bendable region, of the substrate, in a case that the substrate is bent, the groove in the bendable region improves the stress release ability of the interlayer and prevents the signal line from breaking due to excessive local stress, and the yield rate of the substrate is improved.

Next, the substrate, the manufacturing method of the substrate and the display device provided by at least one embodiment of the present disclosure are illustrated with the accompanying drawings.

At least one embodiment of the present disclosure provides a substrate, as illustrated in FIG. 1 to FIG. 3B, the substrate includes a base 100 and an interlayer 200 and at least one signal line 300 which are on the base 100, the base 100 includes a bendable region 110, and the interlayer 200 is on the base 100 and in the bendable region 110, the at least one signal line 300 is at a side of the interlayer 200 facing away from the base 100, and an orthographic projection of the at least one signal line 300 on the base 100 is within an orthographic projection of the interlayer 200 on the base 100. For example, at least a portion of the signal line 300 is curved (for example, the curved portion of the signal line 300 is within the bendable region 110). In the bendable region 110, the interlayer 200 is provided with at least one groove 210 on at least one side of a portion, corresponding to the at least one signal line 300, of the interlayer 200. That is, the at least one groove 210 is in another portion of the interlayer 200, the orthographic projection of which on the base 100 does not overlap the orthographic projection of the signal line 300 on the base 100 (namely the another portion of the interlayer 200 does not correspond to and does not overlap the signal line 300).

For example, at least a portion of the signal line 300 is curved. For example, the portion, in the bendable region, of each one of the at least one signal line is curved. In this way, the extensible length of the signal line 300 is increased and the tensile ability of the signal line 300 is increased, which prevents the signal line 300 from breaking in a case that the substrate (for example, the bendable region 110 of the substrate) is bent.

The interlayer 200 spaces the signal line 300 from the base 100, and in a case that the substrate is bent, the stress generated by the base 100 is not released to the signal line 300 directly; after the transition of the interlayer 200, the stress produced due to the bending of the substrate acts on the signal line 300 uniformly to prevent the signal line 300 from breaking due to the excessive local stress.

In a case that the substrate is bent, at least one groove 210 further releases the stress in the interlayer 200, which reduces the stress of the signal line 300 and prevents the signal line 300 from breaking.

In the embodiment of the present disclosure, the specific shape of the curved portion of the signal line 300 is not limited, as long as it constitutes a nonlinear geometric figure, for example, the curved portion of the signal line 300 is a smooth curve, a curved line that formed of a plurality of straight line segments, or a combination of a straight line segment and a smooth curve. For example, the shape of the curved portion of the signal line 300 is a wavy or a sawtooth or other bending structure, as long as the shape is able to increase the extensible length of the signal line 300.

The embodiments of the present disclosure do not limit the type of the signal line 300. For example, in at least one embodiment of the present disclosure, the at least one signal line 300 includes at least one or more of a gate line, a data line and a common electrode line.

For example, in at least one embodiment of the present disclosure, at least a portion, corresponding to the bendable region 110, of the base 100 is made of a flexible material, in this way, the portion of the bendable region 110 of the substrate is able to be bent, for example, the substrate is bent by 180 degrees. For example, the flexible material includes polyimide or other materials.

In at least one embodiment of the present disclosure, there is no limitation on the type of the substrate. For example, the substrate is used in the display field, for example, the substrate is an array substrate, a color filter substrate, an encapsulation cover or a touch substrate, etc. In the following, taking the substrate as the array substrate for an example, the technical solutions in the following embodiments of the present disclosure are described.

For example, the substrate provided by at least one embodiment of the present disclosure further includes a component region and a pad region, the bendable region is located between the component region and the pad region, and the signal line extends from the component region to the pad region. As illustrated in FIGS. 1, 2A, 2B and 3A, the substrate includes a component region 120 and a pad region 130 and a bendable region 110 is located between the component region 120 and the pad region 130; in the case where a portion, in the bendable region 110, of the base is in a bending state, the pad region 130 overlaps the component region 120. For example, the signal line 300 extends from the component region 120 to the pad region 130.

Figure 1:
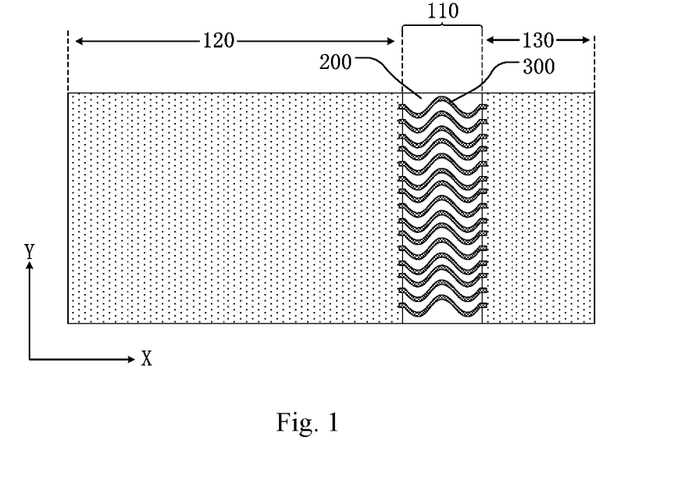
FIG. 1 is a plane view of a substrate provided by at least one embodiment of the present disclosure.

The embodiment of the present disclosure does not limit the distribution of the functional structure of the substrate, and it is arranged according to the actual requirements. For example, the number of the pad region 130 in the substrate is not limited to only one as illustrated in FIG. 1; for example, there may be a plurality of pad regions 130. Accordingly, there are a plurality of bendable regions 110 for connecting the component region 120 and the pad region 130. For example, in at least one embodiment of the present disclosure, the component region 120 of the substrate is a display region, and a display unit is formed in the display region; a display driving circuit is arranged in the pad region 130 (the display driving circuits are used for connecting the external driving chips, etc.); and the bendable region 110 is used as the circuit connection region between the component region 120 and the pad region 130. In the following, taking one pad region 130 being provided as illustrated in FIG. 1 for example, the technical solutions in the following embodiments of the present disclosure are explained.

In at least one embodiment of the present disclosure, the substrate is in a plane state or in a bending state, which is not limited in the embodiment of the present disclosure. In order to facilitate the directional explanation of the position of each component in the substrate, the technical solutions in the following embodiments of the present disclosure is explained by taking the substrate in a plane state as an example. When necessary, the substrate may be bent from the plane state to the bending state. At the same time, the space coordinate system is established based on the plane where the base 100 is located. As an example, the X axis and Y axis of the space coordinate system are parallel to the plane where the base 100 is located, the Z axis is perpendicular to the plane where the base 100 is located, and the direction of the X axis is parallel to the direction of the component region 120 to the pad region 130.

In at least one embodiment of the present disclosure, there is no limitation on the number of signal line and groove provided in the bendable region. For example, the number of the signal line in the bendable region is arranged to be one or more; the number of the groove is also arranged to be one or more. In the following, taking the case that a plurality of signal lines 300 and a plurality of grooves 210 are arranged as illustrated in FIG. 1, FIG. 2A, FIG. 2B and FIG. 3A for example, the technical solutions in the following embodiments of the present disclosure are described.

Figure 2A:
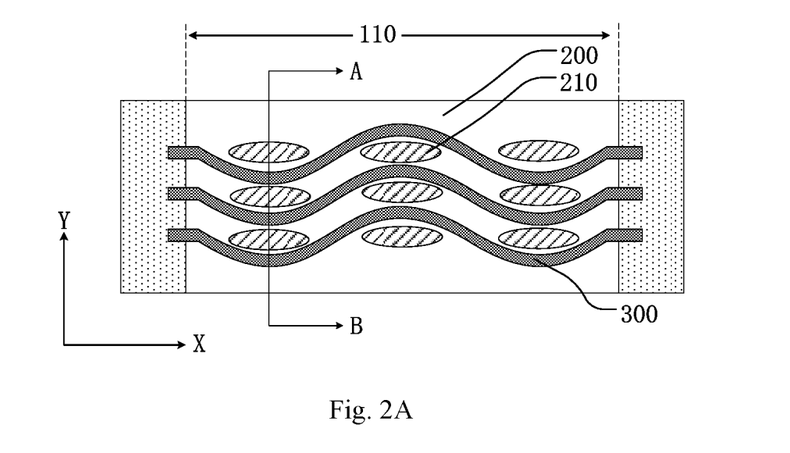
FIG. 2A is a schematic view of a partial structure of the substrate shown in FIG. 1.
Figure 2B:
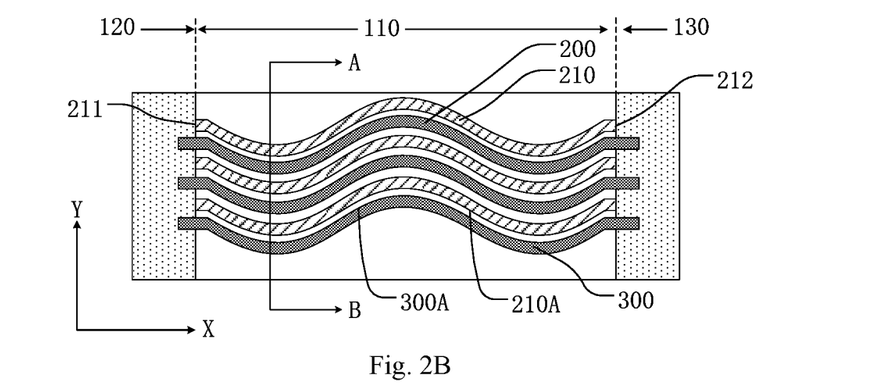
FIG. 2B is another schematic view of the partial structure of the substrate shown in FIG. 1.
Figure 3A:
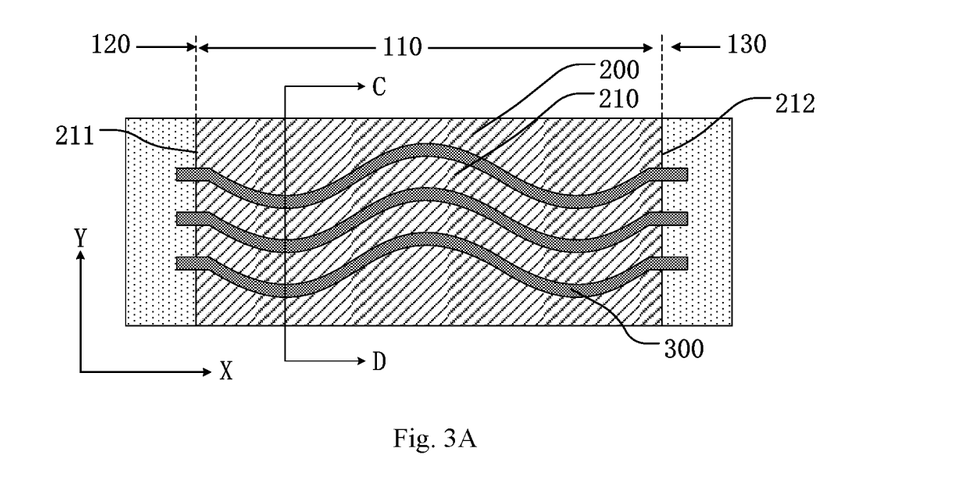
FIG. 3A is still another schematic view of the partial structure of the substrate shown in FIG. 1.

For example, as shown in FIG. 2B and FIG. 3A, the at least one groove 210 in the embodiment of the present disclosure includes a linear groove, for example, the groove 210 between adjacent signal lines 300 is a linear groove. The linear groove extends in a direction in which the signal line adjacent to the linear groove extends. By providing the linear grooves on at least one side of the signal line 300 in the bendable region, it is more advantageous to deform the portions of the interlayer 200 on both sides of the linear groove when the substrate is bent, thereby facilitating the improvement of stress release capability of the interlayer 200.

For example, an edge of the linear groove is parallel to an edge, close to the edge of the linear groove, of the signal line adjacent to the linear groove. For example, FIG. 2B shows three signal lines 300, the groove 210 between the lower signal line 300 and the middle signal line 300 is a linear groove, and the edge 210A, close to the lower signal line 300, of the linear groove is parallel to the edge 300A, close to the linear groove, of the lower signal line 300. This is advantageous to deform the portions of the interlayer 200 on both sides of the linear groove when the substrate is bent, thereby making it more advantageous to increase the stress release ability of the interlayer 200.

For example, as shown in FIG. 2B and FIG. 3A, the groove 210 adjacent to the signal line 300 includes a first end 211 and a second end 212 which are opposite to each other, and the first end 211 reaches at least a boundary of the component region 120 and the bendable region 110, and the second end 212 reaches at least the boundary of the pad region 130 and the bendable region 110. Thus, the groove 210 has a larger length, which is more advantageous to deform the portions of the interlayer 200 located on both sides of the linear groove when the substrate is bent, thereby being more advantageous for improving the stress release ability of the interlayer 200.

For example, in the substrate provided by at least one embodiment of the present disclosure, as illustrated in FIG. 1, FIG. 2A, FIG. 2B and FIG. 3A, the plurality of signal lines 300 are arranged in parataxis (such as being equally spaced) in the bendable region 110. For example, as illustrated in FIG. 2A, the grooves 210 are evenly distributed in each interval region between the adjacent signal lines 300; or for example, as illustrated in FIG. 2B and FIG. 3A, only one linear groove is between the adjacent signal lines 300.

Figure 2C:
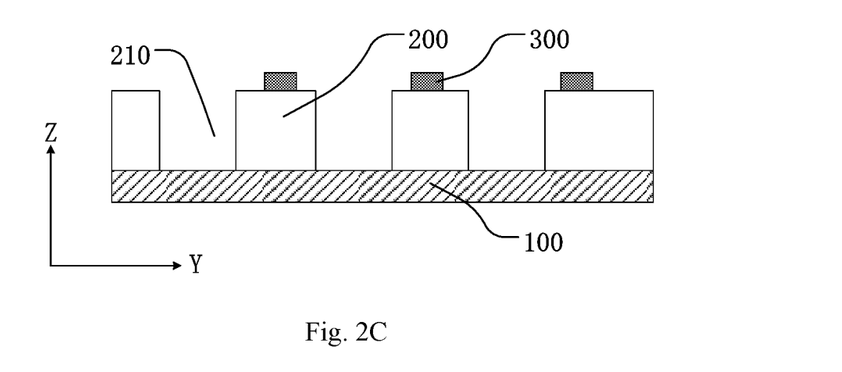
FIG. 2C is a cross section view of the substrate as shown in FIG. 2A or FIG. 2B along A-B.
Figure 3B:
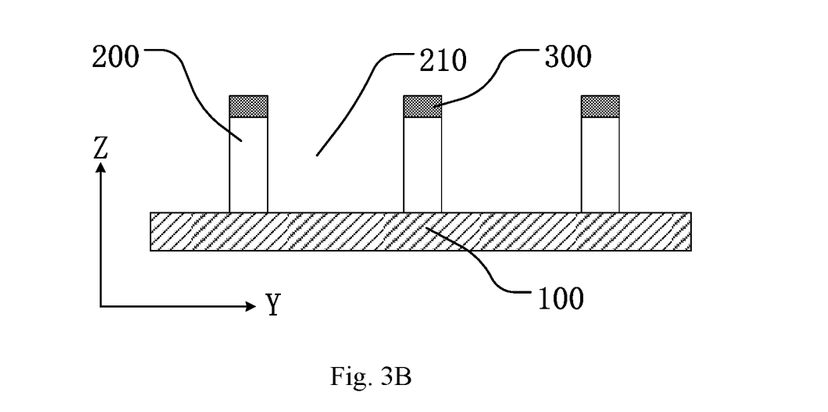
FIG. 3B is a cross section view of the substrate as shown in FIG. 3A along C-D.

In at least one embodiment of the present disclosure, depths of the grooves 210 are not limited. For example, in some embodiments of the present disclosure, in a thickness direction of the interlayer (for example, a direction perpendicular to a plane where the base is located), the depth of the groove is less than the thickness of the interlayer. For example, in other embodiments of the present disclosure, in the thickness direction of the interlayer, the groove passes through the interlayer. For example, as illustrated in FIG. 2C and FIG. 3B, in the direction of the Z axis, the depth of the groove 210 is equal to the thickness of the interlayer 200, in this way, the stress release capacity of the interlayer 200 is further improved, which prevents the signal line 300 from breaking.

In at least one embodiment of the present disclosure, the distribution of the curved portion of the signal line in the bendable region is not limited. For example, in order to facilitate preventing the signal line from breaking, the curved portion of the signal line is in the bendable region. For example, the curved portion of the signal line are distributed in a middle region of the bendable region in the direction from the component region to the pad region, or distributed in other regions of the bendable region.

For example, in at least one embodiment of the present disclosure, in a direction from the component region to the pad region, a distance from a center of a curved portion of the signal line to the component region is equal to a distance from the center of the curved portion of the signal line to the pad region. In a case that the substrate is bent, the deformation of the middle region of the bendable region is the largest, accordingly, the deformation (for example, stretching) of the signal line at this position is the largest, and the curved portion of the signal line is at the center of the bendable region, which further reduces the degree of stress concentration in the signal line and prevents the signal line from breaking.

In the embodiments of the present disclosure, there is no limitation on the proportion that the curved portion of the signal line in the bendable region. For example, in some embodiments of the present disclosure, the portion of the signal line in the bendable region is partially arranged as a curve. For example, in some embodiments of the present disclosure, the whole portion of the signal line in the bendable region is arranged as a curve. For example, as illustrated in FIG. 1 and FIG. 2A, all the portion of the signal line 300 in the bendable region 110 is curved, in this way, the degree of stress concentration in the signal line is further reduced, which prevents the signal line from breaking.

In at least one embodiment of the present disclosure, the distribution range of grooves in the interlayer is not limited. For example, the portion of the interlayer that does not overlap the signal line is partly provided with grooves (as illustrated in FIG. 2A and FIG. 2B), or the whole of the portion of the interlayer that does not overlap the signal line is provided with grooves.

For example, in the substrate provided by at least one embodiment of the present disclosure, each one of both sides of the portion, corresponding to the signal line, of the interlayer is provided with at least one groove. For example, the whole of the portion of the interlayer that does not overlap the signal line is arranged as a groove. For example, as illustrated in FIG. 3A and FIG. 3B, in the bendable region 110, the whole of the portion of the interlayer 200 that does not overlap the signal line 300 is arranged as grooves 210. In other words, in the bendable region 110, the orthographic projection of the interlayer 200 on the base 100 coincides with the orthographic projection of the signal line 300 on the base 100. In this way, the stress release ability of the interlayer is further improved, so as to prevent the signal line 300 from breaking due to large local stress when the substrate is bent.

In addition, in some embodiments, as illustrated in FIG. 2C and FIG. 3B, the groove 210 passes through the interlayer 200, that is, the whole of the portion of the interlayer 200 which does not overlap the signal line 300 is hollowed out. In this way, the stress release ability of the interlayer is further improved, which prevents the signal line 300 from breaking due to the excessive local stress when the substrate is bent.

For example, in some embodiments of the present disclosure, each of both sides of the portion, corresponding to the signal line, of the interlayer are provided with at least one grooves. For example, each of both sides of the portion, corresponding to the signal line, of the interlayer are provided with a groove; or each of both sides of the portion, corresponding to the signal line, of the interlayer are provided with a plurality of grooves. For example, a portion, between partial grooves, of the interlayer 200 does not correspond to the signal line.

For example, in the substrate provided by at least one embodiment of the present disclosure, the interlayer is in direct contact with the base. As an example, as illustrated in FIG. 3B, the interlayer 200 is in direct contact with the base 100. For example, as illustrated in FIG. 2C and FIG. 3B, the interlayer 200 is in direct contact with the signal line 300. In this way, the signal line 300 is not easy to break due to excessive local stress in the state of tension, for example.

It should be noted that, in at least one embodiment of the present disclosure, the thickness of the interlayer and the thickness of the signal line are not limited, which are arranged according to the actual process requirements. With the increase of the thickness of the interlayer, the bending radius of the signal line increases during the bending of the substrate, and the ability of the interlayer to release the stress increases, which makes the stress distribution on the signal line more uniform; accordingly, with the decrease of the thickness of the interlayer, the bending radius of the signal line decreases during the bending of the substrate, and the ability of the interlayer to release the stress decreases, which makes the stress concentration on the signal line easy to occur. Therefore, the thickness of the interlayer is designed according to the material of the interlayer and the specific shape of the curved portion of the signal lines and the like, which are not limited in the embodiment of the present disclosure.

For example, as illustrated in FIG. 2C and FIG. 3B, in the direction of the Z axis, the thickness of the interlayer 200 is from about 0.5 μm to about 2 μm, further about 0.8 μm, 1.2 μm or 1.6 μm, etc., and the embodiments of the present disclosure are not limited to this.

For example, as illustrated in FIG. 2C and FIG. 3B, in the direction of the Z axis, the thickness of the signal line 300 is about 5000 A to 9000 A, for example, the thickness of the signal line 300 is about 6000 A, 7000 A or 8000 A, etc., and the embodiments of the present disclosure are not limited to this. For example, the width of the signal line 300 (for example, the width in the Y axis direction) is about 3 μm to 4 μm, in a case that a plurality of signal lines 300 are arranged, the distance between adjacent signal lines 300 is about 20 μm to 30 μm, and the embodiments of the present disclosure are not limited to this. For example, the material for manufacturing signal line 300 is a conductive material with a good ductility, such as gold, silver, copper, aluminum or other metals or their alloys.

In at least one embodiment of the present disclosure, the material of the interlayer is not limited. For example, the material for forming the interlayer includes a flexible material to improve the stress release capacity. For example, in at least one embodiment of the present disclosure, the material of the interlayer includes an organic material, namely the interlayer includes an organic material layer. For example, the organic material is a polymer resin material, and the polymer resin usually has a good flexibility and a good stress release ability. For example, the material for forming the interlayer includes at least one of polyimide material or photoresist or the like. By forming the interlayer using an organic material, it is advantageous to improve the stress release ability of the interlayer.

For example, in the substrate provided by at least one embodiment of the present disclosure, a Young's modulus of a material of the interlayer is less than or equal to that of a material of the base. In this way, the stress produced by the interlayer is smaller than that produced by the base, so the interlayer releases the stress generated by the base due to bending the base, reduces the stress transferred to the signal line to prevent the signal line from breaking. For example, both the interlayer and the base are formed of a polyimide material or similar material.

For example, in at least one embodiment of the present disclosure, the interlayer is manufactured by an existing structural layer in the component region of the substrate, thus it can simplify the manufacturing process of the substrate and reduce the cost.

Figure 4:
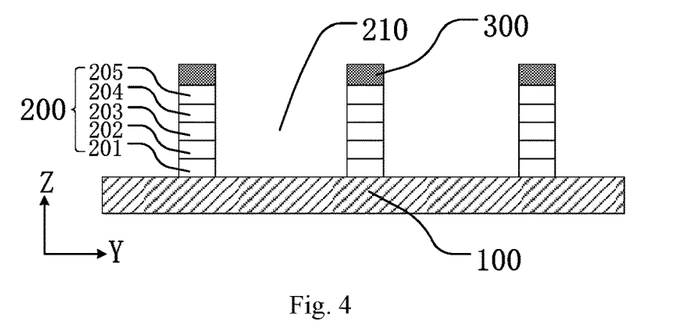
FIG. 4 is a schematic view of the partial structure of the substrate provided by another embodiment of the present disclosure.

For example, in at least one embodiment of the present disclosure, the substrate is an array substrate, the substrate further includes at least one of a buffer layer, a gate insulating layer, an interlayer dielectric layer, a passivation layer and a planarization layer on the base; and a portion, in the bendable region, of at least one of the buffer layer, the gate insulating layer, the interlayer dielectric layer, the passivation layer and the planarization layer serves as the interlayer. FIG. 4 is a schematic view of a partial structure of the substrate provided by another embodiment of the present disclosure. As an example, as illustrated in FIG. 4, the interlayer 200 includes a lamination having a plurality of layers. The portion of the substrate (array substrate) in the component region 120 (display region) is provided with the buffer layer 201, the gate insulating layer 202, the interlayer dielectric layer 203, the passivation layer 204 and the planarization layer 205; and the portions, in the bendable region 110, of the buffer layer 201, the gate insulating layer 202, the interlayer dielectric layer 203, the passivation layer 204 and the planarization layer 205 (each is collectively referred to as a structural layer) are formed as the interlayer 200. The buffer layer 201, the gate insulating layer 202, the interlayer dielectric layer 203, the passivation layer 204 and the planarization layer 205 arranged on the base (array substrate) may refer to the related structure of the conventional thin film transistor, which is not limited in the embodiment of the present disclosure.

For example, in a case that the portion, in the bendable region 110, of at least one structural layer described above is formed as the interlayer 200, the material for manufacturing the structural layer includes a flexible material (for example, an organic insulating material). The organic insulating material is usually thicker than an inorganic insulating material, in a case that the performance of the components in the array substrate such as thin film transistors in the array substrate is ensured, the structural layer for forming the interlayer is selected according to the actual process requirements, which is not limited in the embodiments of the present disclosure.

As an example, the portion of the passivation layer 204 and the portion of planarization layer 205 which are in the bendable region 110 are formed as the interlayer 200, materials for manufacturing the passivation layer 204 and the planarization layer 205 include an organic insulating material, in this way, the electrical properties of the thin film transistor in the array substrate are not affected.

Illustratively, because the planarization layer 205 is made of an organic material to have a large thickness to have a planarization function, it is possible to utilize only the portion, in the bendable region, of the planarization layer 205 (an example of the organic material layer described above) to form the interlayer, which simplifies the manufacturing process. For example, in a case where the interlayer is formed using only the planarization layer 205, the portion, in the bendable region, of the planarization layer 205 is in direct contact with the signal line 300 located above it.

At least one embodiment of the present disclosure further provides a display device, and the display device includes the substrate in any one of the above embodiments. For example, the substrate is an array substrate in the display device. In the display device provided by at least one embodiment of the present disclosure, the bendable region 110 of the substrate is bent, and the pad region 130 of the substrate is on the back of the component region 120 (the side, facing away from the interlayer 200, of the base 100 in the component region 120). For example, the substrate provided by at least one embodiment of the present disclosure is a flexible substrate, and accordingly, the display device including the substrate is a flexible display device. For example, the display device is used in any display products or components with a display function, such as a TV, a digital camera, a cell phone, a watch, a tablet, a laptop, a navigator, etc.

An example of the display device is a liquid crystal display panel, and the liquid crystal display panel includes the substrate in any one of the above mentioned embodiments and an opposite substrate, which are opposite to each other to form a liquid crystal cell filled with liquid crystal material. The opposite substrate, for example, is a color filter substrate. The pixel electrode of each pixel unit in the array substrate is used for applying an electric field to control the rotation degree of the liquid crystal material, and further the display operation is performed.

Another example of the display device is an organic light-emitting diode display panel, a stack of organic light-emitting materials is formed on the substrate of the display panel, and the anode or the cathode of each pixel unit is used for driving the organic light-emitting material to emit light, and further the display operation is performed.

Another example of the display panel is an electronic paper display panel, an electronic ink layer is formed on the substrate of the display panel, and the pixel electrode of each pixel unit are used for applying a voltage for driving charged microparticles in electronic ink to move to perform display operations.

For example, the display device is any one of the display products with a display function, such as a display panel, a TV, a digital camera, a cell phone, a watch, a tablet, a laptop, a navigator, etc.

At least one embodiment of the present disclosure provides a manufacturing method of a substrate, and the manufacturing method includes: forming an interlayer in the bendable region of a base; forming at least one signal line on a side, facing away from the base, of the interlayer, so that an orthographic projection of the at least one signal line on the base is within an orthographic projection of the interlayer on the base in the bendable region; and forming at least one groove in the interlayer and on at least one side of a portion, corresponding to the at least one signal line, of the interlayer (that is, at least one groove is formed in the portion, which does not overlap the signal line, of the interlayer).

For example, at least a portion of the signal line is formed to be curved. For example, the portion, which is curved, of the signal line is in the bendable region.

In the substrate obtained by the above mentioned manufacturing method, at least one groove is formed in the interlayer, in a case that the substrate is bent, the groove improves the stress release ability of the interlayer to prevent the signal line from breaking due to excessive local stress, and the yield of the substrate is improved.

For example, in the manufacturing method of the substrate provided by at least one embodiment of the present disclosure, the forming of the interlayer and the signal line includes: depositing an insulating material film on the base; depositing a conductive material film on the insulating material film and patterning the conductive material film to form the signal line; and patterning the insulating material film, so that at least one groove is formed on at least one side of the portion, corresponding to the signal line, of the insulating material film to form the interlayer. The signal line and the interlayer are manufactured by different patterning processes, in this way, the position of the groove formed in the interlayer is easy to be selected.

For example, in the manufacturing method of the substrate provided by at least one embodiment of the present disclosure, forming the interlayer and the signal line includes: depositing an insulating material film on the base; depositing a conductive material film on the insulating material film; and performing one patterning process on the conductive material film and the insulating material film to form the signal line and the interlayer. The signal line and the interlayer are manufactured simultaneously by one patterning process, which simplifies the manufacturing process of the substrate and reduces the cost. In this way, the portion of the interlayer that does not overlap the signal line is formed as the groove, which further enhances the stress release ability of the interlayer, prevents excessive local stress of the signal line and prevents the signal line from breaking in a case that the substrate is bent.

For example, in the manufacturing method of the substrate provided by at least one embodiment of the present disclosure, the material of the interlayer includes a photoresist material, forming the interlayer and the signal line includes: depositing a photoresist layer on the base; depositing a conductive material film on the photoresist layer; performing a patterning process to the conductive material film to form the signal line; and exposing the photoresist layer by using the signal line as a mask and developing the photoresist layer that has been exposed to form the interlayer. The material for forming the interlayer is the photoresist material, and the signal line is used as the mask to form the groove in the interlayer, which does not need to provide an additional mask to form the groove, thus the manufacturing process of the substrate is simplified and the cost is reduced.

The specific structure of the substrate manufactured by the manufacturing method of at least one embodiment of the present disclosure refers to the relevant contents in the above mentioned embodiments (embodiments of the substrate), which is omitted in the embodiment of the present disclosure.

Figure 5A:
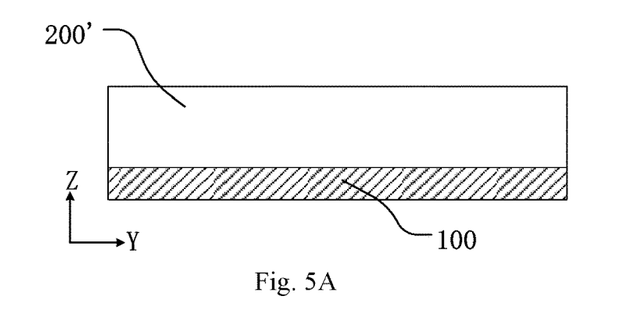
FIG. 5A to FIG. 5C are views illustrating a process in a manufacturing method of the substrate provided by at least one embodiment of the present disclosure.
Figure 5B:
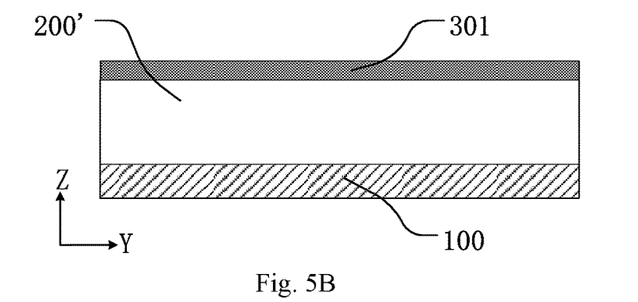
Figure 5C:
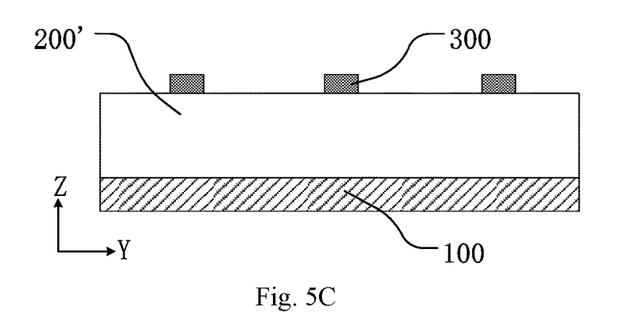

Following, taking the structure illustrated in FIG. 3B for example, in an example of the embodiment of the present disclosure, the manufacturing method of the substrate is described. FIG. 5A to FIG. 5C illustrate a process of the manufacturing method of the substrate provided by at least one embodiment of the present disclosure. For example, as illustrated in FIG. 5A to FIG. 5C, the process of the manufacturing method of the substrate provided by at least one embodiment of the present disclosure is described as follows.

As illustrated in FIG. 5A, the base 100 (only the portion of the base 100 in the bendable region 110 is illustrated) is provided, and an insulating material film 200' for forming the interlayer is deposited in the bendable region 110 of the base 100.

As illustrated in FIG. 5B, a conductive material film 301 is deposited on a side of the insulating material film 200' facing away from the base 100.

As illustrated in FIG. 5C, patterning the conductive material film to form at least one signal line 300. For example, at least a portion of the signal line 300 in the bendable region 110 is formed as a curve.

For example, in at least one embodiment of the present disclosure, the patterning process includes a dry etching process or a wet etching process. For example, the process of the patterning process includes: coating a photoresist layer on the structural layer to be patterned, exposing the photoresist layer by using a mask plate, developing the exposed photoresist layer to obtain a photoresist pattern, etching the structure layer by using the photoresist pattern as a mask, then optionally removing the photoresist pattern.

As illustrated in FIG. 3B, the insulating material film 200' is patterned to form at least one groove 210 in the portion of the insulating material film 200' that does not overlap the signal line 300. For example, in the direction of the Z axis, the groove 210 is formed to pass through the interlayer 200. For example, all the portions of the interlayer 200 that do not overlap the signal line 300 are formed as grooves 210.

It should be noted that, the manufacturing method of the substrate is not limited to the process as illustrated in FIG. 5A to FIG. 5C, the embodiment of the present disclosure is not limited herein, as long as the substrate in the above mentioned embodiments (with respect to the embodiments of the substrate) is obtained by the manufacturing method.

For example, in at least one embodiment of the present disclosure, as illustrated in FIG. 5B, after the insulating material film 200' and the conductive material film 301 are formed on the base 100, one patterning process is performed on the insulating material film 200' and the conductive material film 301, to form the substrate as illustrated in FIG. 3B directly. In this situation, for example, all the portions of the insulating material film 200' that do not overlap the signal line 300 are formed as grooves 210.

For example, in at least one embodiment of the present disclosure, as illustrated in FIG. 5C, the material for forming the insulating material film 200' is a photoresist (for example, positive photoresist) material, after the signal line 300 is formed on the insulating material film 200', the insulating material film 200' is exposed by using the signal line 300 as a mask and the insulating material film 200' that has been exposed is developed to obtain the substrate illustrated in FIG. 3B. In this case, for example, all the portions of the insulating material film 200' that do not overlap the signal line 300 are formed as grooves 210.

Embodiments of the present disclosure provide a substrate and its manufacturing method and a display device and have at least one of the following beneficial effects.

(1) At least one embodiment of the present disclosure provides a substrate, at least one groove is arranged in the interlayer in the bendable region, in a case that the substrate is bent, the groove improves the stress release ability of the interlayer, and prevents the signal line from breaking due to excessive local stress, and the yield rate of the substrate is improved.

(2) In the substrate provided by at least one embodiment of the present disclosure, all the portions of the interlayer that do not overlap the signal line are formed as grooves, which further enhances the stress release ability of the interlayer, which also prevents excessive local stress of signal line and prevents signal line from breaking in a case that the substrate is bent.

For the present disclosure, the following points need to be explained.

(1) The drawings of the embodiments of the present disclosure are only related to the structures mentioned in the embodiments of the present disclosure, and other structures can be obtained by general designs;

(2) The arrangement of the same components in the above embodiments regarding the substrate, the manufacturing method of the substrate and the display device can be mutually referred to.

(3) The embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. A substrate, comprising:
   a base comprising a bendable region;
   an interlayer on the base and in the bendable region;
   signal lines at a side, facing away from the base, of the interlayer; and
   at least one of a buffer layer, a gate insulating layer, an interlayer dielectric layer, a passivation layer and a planarization layer on the base,
   wherein
   in the bendable region, orthographic projections of the signal lines on the base are within an orthographic projection of the interlayer on the base;
   in the bendable region, the interlayer is provided with grooves, and the grooves are arranged between every two adjacent signal lines of the signal lines; and
   a portion, in the bendable region, of at least one of the buffer layer, the gate insulating layer, the interlayer dielectric layer, the passivation layer and the planarization layer serves as the interlayer.

2. The substrate according to claim 1, wherein at least a portion, in the bendable region, of each of the signal lines is curved.

3. The substrate according to claim 1, wherein the grooves comprise a linear groove extending in a direction in which the signal lines adjacent to the linear groove extend.

4. The substrate according to claim 3, wherein an edge of the linear groove is parallel to an edge, close to the edge of the linear groove, of the signal lines adjacent to the linear groove.

5. The substrate according to claim 1, further comprising a component region and a pad region, wherein
   the bendable region is between the component region and the pad region;
   in a case where a portion, in the bendable region, of the base is in a bent state, the pad region overlaps the component region; and
   each of the signal lines extends from the component region to the pad region.

6. The substrate according to claim 5, wherein each of the grooves adjacent to the signal lines comprises a first end and a second end which are opposite to each other, the first end reaches at least a boundary of the component region and the bendable, and the second end reaches at least a boundary of the pad region and the bendable region.

7. The substrate according to claim 5, wherein in a direction from the component region to the pad region, a distance from a center of a curved portion of one of the signal lines to the component region is equal to a distance from the center of the curved portion of the one of the signal lines to the pad region.

8. The substrate according to claim 1, wherein in a thickness direction of the interlayer, each of the grooves passes through the interlayer.

9. The substrate according to claim 1, wherein an entirety of a portion, in the bendable region, of each of the signal lines is curved.

10. The substrate according to claim 1, wherein each one of two sides of the portion, corresponding to each of the signal lines, of the interlayer is provided with the grooves.

11. The substrate according to claim 1, wherein the interlayer is in direct contact with the base.

12. The substrate according to claim 1, wherein a Young's modulus of a material of the interlayer is less than or equal to a Young's modulus of a material of the base.

13. The substrate according to claim 1, wherein a material of the interlayer comprises an organic material.

14. The substrate according to claim 1, wherein
   the interlayer comprises an organic material layer in direct contact with the signal lines.

15. A display device, comprising the substrate according to claim 1.

16. A manufacturing method of a substrate, comprising:
   forming an interlayer in a bendable region of a base;
   forming signal lines on a side, facing away from the base, of the interlayer, wherein in the bendable region, an orthographic projection of the signal line on the base is within an orthographic projection of the interlayer on the base;
   forming grooves in the interlayer, and the grooves are arranged between every two adjacent signal lines of the signal lines; and
   forming at least one of a buffer layer, a gate insulating layer, an interlayer dielectric layer, a passivation layer and a planarization layer on the base, wherein a portion, in the bendable region, of at least one of the buffer layer, the gate insulating layer, the interlayer dielectric layer, the passivation layer and the planarization layer serves as the interlayer.

17. The manufacturing method according to claim 16, wherein forming the interlayer and the signal lines comprises:
   forming an insulating material film on the base;
   forming a conductive material film on the insulating material film and performing a patterning process to the conductive material film to form the signal lines; and
   performing a patterning process to the insulating material film, and forming the grooves to form the interlayer.

18. The manufacturing method according to claim 16, wherein forming the interlayer and the signal lines comprises:
   forming an insulating material film on the base;
   forming a conductive material film on the insulating material film; and performing a patterning process to the conductive material film and the insulating material film to form the signal lines and the interlayer.

19. The manufacturing method according to claim 16, wherein a material of the interlayer comprises a photoresist material, and forming the interlayer and the signal lines comprises:

forming a photoresist layer on the base;

forming a conductive material film on the photoresist layer;

performing a patterning process to the conductive material film to form the signal lines; and exposing the photoresist layer by using the signal lines as a mask and developing the photoresist layer that has been exposed to form the interlayer.

* * * * *